(12) United States Patent
Lee et al.

(10) Patent No.: US 8,115,244 B2
(45) Date of Patent: Feb. 14, 2012

(54) TRANSISTOR OF VOLATILE MEMORY DEVICE WITH GATE DIELECTRIC STRUCTURE CAPABLE OF TRAPPING CHARGES

(75) Inventors: Sang-Don Lee, Ichon-shi (KR);
Yil-Wook Kim, Ichon-shi (KR);
Jin-Hong Ahn, Ichon-shi (KR);
Young-June Park, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 13/094,692

(22) Filed: Apr. 26, 2011

(65) Prior Publication Data

US 2011/0198701 A1 Aug. 18, 2011

Related U.S. Application Data

(62) Division of application No. 11/375,792, filed on Mar. 14, 2006, now abandoned, which is a division of application No. 10/883,184, filed on Jun. 30, 2004, now abandoned.

(30) Foreign Application Priority Data

Mar. 22, 2004 (KR) .................................. 2004-19363

(51) Int. Cl.
*H01L 29/76* (2006.01)
(52) U.S. Cl. .. 257/314; 257/324; 257/368; 257/E29.309
(58) Field of Classification Search .................. 257/288, 257/296, 314, 315, 324, 368, 369, E29.3, 257/E29.309
See application file for complete search history.

(56) References Cited

U.S. PATENT DOCUMENTS

| 4,047,974 | A | 9/1977 | Harari |
| 5,608,250 | A | 3/1997 | Kalnitsky |
| 5,959,328 | A | 9/1999 | Krautschneider et al. |
| 6,180,458 | B1 | 1/2001 | Krautschneider et al. |
| 6,228,723 | B1 | 5/2001 | Kim |
| 6,265,739 | B1 * | 7/2001 | Yaegashi et al. .............. 257/296 |
| 6,274,902 | B1 | 8/2001 | Kauffman et al. |

(Continued)

FOREIGN PATENT DOCUMENTS

CN 1111825 11/1995
(Continued)

OTHER PUBLICATIONS

On the Retention Time Distribution of Dynamic Random Access Memory (DRAM), IEEE Transactions on Electron Devices, vol. 45, No. 6, Jun. 1998, pp. 1300-1309.

(Continued)

*Primary Examiner* — Tuan N. Quach
(74) *Attorney, Agent, or Firm* — Blakely, Sokoloff, Taylor & Zafman

(57) ABSTRACT

The present invention relates to a transistor of a volatile memory device with gate dielectric structure capable of trapping charges and a method for fabricating the same. The transistor in a cell region of a volatile memory device includes a substrate of a first conductive type; a gate dielectric structure capable of trapping charges and formed on the substrate; a gate formed on the gate dielectric structure; a gate insulation layer formed on the gate; a source/drain of a second conductive type formed in a predetermined region of the substrate disposed beneath each lateral side of the gate; and a channel ion implantation region of the first conductive type formed in a predetermined region of the substrate disposed beneath the gate.

8 Claims, 19 Drawing Sheets

U.S. PATENT DOCUMENTS

| | | |
|---|---|---|
| 6,368,907 B1 * | 4/2002 | Doi et al. ............... 438/217 |
| 6,421,275 B1 | 7/2002 | Chen et al. |
| 6,445,046 B1 | 9/2002 | Hofmann et al. |
| 6,479,862 B1 | 11/2002 | King et al. |
| 6,653,191 B1 | 11/2003 | Yang et al. |
| 6,716,663 B2 | 4/2004 | Morita et al. |
| 6,720,133 B1 | 4/2004 | Ramsbey et al. |
| 6,821,842 B1 | 11/2004 | Lee et al. |
| 7,001,814 B1 | 2/2006 | Halliyal et al. |
| 7,157,325 B2 * | 1/2007 | Arai ............... 438/221 |
| 2003/0003770 A1 | 1/2003 | Morita et al. |
| 2003/0025148 A1 * | 2/2003 | Hsieh et al. ............... 257/315 |
| 2003/0032242 A1 | 2/2003 | Lee et al. |
| 2003/0134476 A1 | 7/2003 | Roizin et al. |
| 2003/0205727 A1 | 11/2003 | Shin et al. |
| 2003/0235075 A1 | 12/2003 | Forbes |
| 2004/0047186 A1 | 3/2004 | Tsai et al. |
| 2004/0104416 A1 | 6/2004 | Takaura et al. |
| 2004/0185621 A1 | 9/2004 | Sadd et al. |
| 2004/0217411 A1 * | 11/2004 | Ohtani et al. ............... 257/314 |
| 2004/0217420 A1 | 11/2004 | Yeo et al. |
| 2005/0054161 A1 | 3/2005 | Gutman et al. |

FOREIGN PATENT DOCUMENTS

| | | |
|---|---|---|
| CN | 1226752 | 8/1999 |
| CN | 1345092 | 4/2002 |
| CN | 1389927 | 1/2003 |
| EP | 0655 788 A1 | 5/1995 |
| JP | 04-357865 | 12/1992 |
| JP | 10-189891 | 7/1998 |
| JP | 2000-307083 | 11/2000 |
| JP | 2001-156188 | 6/2001 |
| JP | 2003-188276 | 7/2003 |
| WO | WO 03/069676 A1 | 8/2003 |

OTHER PUBLICATIONS

Retention Reliability Enhanced SONOS NVSM with Scaled Programming Voltage, IEEAC paper #706, Updated Sep. 24, 2001, 8 pages.

* cited by examiner

TRANSISTOR OF VOLATILE MEMORY DEVICE WITH GATE DIELECTRIC STRUCTURE CAPABLE OF TRAPPING CHARGES

CROSS-REFERENCE TO RELATED APPLICATION

The present patent application is a divisional application claiming the benefit of application Ser. No. 11/375,792, filed Mar. 14, 2006 abandoned, which is a divisional application claiming the benefit of application Ser. No. 10/883,184, filed Jun. 30, 2004 abandoned.

FIELD OF THE INVENTION

The present invention relates to a volatile memory technology; and, more particularly, to a transistor of a volatile memory with a gate dielectric structure of oxide-nitride-oxide and a method for fabricating the same.

DESCRIPTION OF RELATED ARTS

As known, each cell in a volatile dynamic random access memory (DRAM) device includes one transistor and one capacitor.

FIG. 1 is a cross-sectional view of a conventional transistor in a cell region of a DRAM device. Two wells 103 and 104 are sequentially formed in a silicon substrate 101. Since an N-channel transistor is typically adopted for the DRAM device, the aforementioned two wells are a deep N-type well 103 formed in the silicon substrate 101 of P-type and a deep P-type well 104 defined within the deep N-type well 103.

Also, a device isolation layer 102 is formed in the silicon substrate 101 by performing a shallow trench isolation (STI) process. After the formation of the device isolation layer 102, a field region in which the device isolation layer 102 is formed and an active region are defined. A plurality of gate structures 107 including a gate oxide layer 106 are formed on an active region. Herein, the gate oxide layer 106 is made of silicon dioxide ($SiO_2$). A channel ion implantation region 105 for controlling a threshold voltage is formed in each of channel regions defined within portions of the P-type well 104 disposed beneath the gate structures 107. Also, there is a source/drain 108 in each predetermined region of the silicon substrate 101 allocated between the gate structures 107.

The transistor having the above described structure has a threshold voltage ($V_{TH}$) defined as follows.

$$V_{TH} = \Phi_{MS} - \frac{Q_{EFF}}{C_{OX}} + 2 \cdot |\Phi_F| - \frac{Q_B}{C_{OX}} = \quad \text{Eq. 1}$$

$$\Phi_{MS} - \frac{Q_{EFF}}{C_{OX}} + 2 \cdot |\Phi_F| + \frac{2 \cdot \sqrt{\varepsilon_s \cdot q \cdot N_A \cdot |\Phi_F|}}{C_{OX}}$$

Herein, '$\Phi_{MS}$', '$Q_{EFF}$', '$C_{OX}$', '$\Phi_F$', '$Q_B$', '$\varepsilon_s$', 'q', and '$N_A$' express a linear function between the gate structure 107 and the channel ion implantation region 105, a charge amount of a total effective oxide layer per unit area when a gate voltage ($V_G$) equals to the threshold voltage ($V_{TH}$), a capacitance of the gate oxide layer per unit area, a Fermi potential of a semiconductor region, a charge amount per unit area of a depletion layer in the semiconductor region, a permittivity of the semiconductor region, a charge amount of electrons, and a doping concentration of an impurity implanted into the semiconductor region, respectively.

The charge amount of the total effective oxide layer per unit area '$Q_{EFF}$' is expressed as follows.

$$Q_{EFF} = Q_{SS} + Q_{it(\Phi S=2\Phi F)} + \int_0^{T_{OX}} \frac{x \cdot \rho(x)}{T_{OX}} \cdot dx \quad \text{Eq. 2}$$

Herein, '$Q_{ss}$', '$Q_{it}$', '$\Phi_s$', '$\rho(x)$', and '$T_{OX}$' express a surface state fixed charge amount in an interface between the semiconductor region and the gate oxide layer 106, an interface state charge amount in an interface between the semiconductor region and the gate oxide layer 106, a surface potential of the semiconductor region, an average charge density of the gate oxide layer 106 measured from an interface having a distance 'x' between the semiconductor region and the gate oxide layer 106 to a predetermined distance 'x+dx', and a thickness of the gate oxide layer 106, respectively.

Therefore, on the basis of the equations 1 and 2, the threshold voltage ($V_{TH}$) of the transistor in a cell region can be defined as follows.

$$V_{TH} = \Phi_{MS} - \frac{1}{C_{OX}} \cdot \left[ Q_{ss} + Q_{it(\Phi s=2\Phi F)} + \int_0^{T_{OX}} \frac{x \cdot \rho(x)}{T_{OX}} \cdot dx \right] +$$

$$2 \cdot |\Phi_F| + \frac{2 \cdot \sqrt{\varepsilon_s \cdot q \cdot N_A \cdot |\Phi_F|}}{C_{OX}}$$

Meanwhile, advancement in DRAM technology has led to a gradual decrease in a minimum design rule, which in turn, causes a channel length and a width of the transistor of the DRAM device to be decreased. Thus, the threshold voltage of the transistor decreases because of a short channel effect and an inverse narrow width effect. As a result of this decreased threshold voltage, a punch-through phenomenon more frequently occurs between a source and a drain.

However, for a normal operation of the DRAM device, it is necessary to maintain the threshold voltage of the transistor of the DRAM device, and a voltage inducing the punch-through phenomenon should be higher than an operation voltage.

Therefore, doping concentrations of a channel region and a well region of the transistor need to be increased in order to obtain a decrease in the threshold voltage and to prevent the punch-through phenomenon. That is, as shown in the equation 3, a value of '$V_{TH}$' is increased by increasing a value of '$N_A$', a width of a depletion layer between the source and the drain is decreased to increase the voltage inducing the punch-through phenomenon.

Nevertheless, the increase in the doping concentration of the channel region and the well region causes potentials of the source and the drain to be increased, further resulting in adverse effects of increasing junction leakage and deteriorating a refresh characteristic of the DRAM device. These described adverse effects are shown in FIGS. 2A and 2B. Particularly, FIG. 2A is a graph showing that the junction leakage increases as a doping concentration of boron into the P-type well increases. FIG. 2B is a graph showing that a data retention time decreases as the doping concentration of the P-type well increases.

As described above, in the transistor of the conventional DRAM device, the threshold voltage characteristic, the punch-through characteristic and the refresh characteristic have an offset relationship with each other. Characteristics of the transistor of the DRAM device are retained through compromising those characteristics.

However, as the design rule of the DRAM device has been decreased to the size less than 100 nm, it may become much difficult to satisfy the threshold voltage characteristic, the punch-through characteristic and the refresh characteristic simultaneously only by increasing the doping concentrations of the channel region and the well region.

SUMMARY OF THE INVENTION

It is, therefore, an object of the present invention to provide a transistor of a volatile memory device capable of obtaining an intended level of a threshold voltage along with a lowered doping concentration of a channel ion implantation region and a method for fabricating the same.

In accordance with an aspect of the present invention, there is provided a transistor in a cell region of a volatile memory device, including: a substrate of a first conductive type; a gate dielectric structure capable of trapping charges and formed on the substrate; a gate formed on the gate dielectric structure; a gate insulation layer formed on the gate; a source/drain of a second conductive type formed in a predetermined region of the substrate disposed beneath each lateral side of the gate; and a channel ion implantation region of the first conductive type formed in a predetermined region of the substrate disposed beneath the gate.

In accordance with another aspect of the present invention, there is provided a volatile memory device, including: a first transistor for use in a memory cell provided with a gate dielectric structure including: a bottom gate dielectric layer; a middle gate dielectric layer for trapping charges; and a top gate dielectric layer; and a second transistor for use in a logic circuit provided with a gate dielectric structure of a single oxide layer.

In accordance with still another aspect of the present invention, there is provided a volatile memory device, including: a first N-channel metal oxide semiconductor (NMOS) transistor for use in a memory cell provided with a gate dielectric structure including: a bottom gate dielectric layer; a middle gate dielectric layer; and a top gate dielectric layer; a second NMOS transistor for use in a logic circuit provided with a gate dielectric structure of a single oxide layer; and a P-channel metal oxide semiconductor (PMOS) transistor for use in a logic circuit provided with a gate dielectric structure including; a bottom gate dielectric layer; a middle gate dielectric layer; and a top gate dielectric layer.

In accordance with still another aspect of the present invention, there is provided a volatile memory device, including: a transistor for use in a memory cell, the transistor including: a substrate of a first conductive; a gate dielectric structure capable of trapping charges and formed on the substrate; a gate formed on the gate dielectric structure; a gate insulation layer formed on the gate; a source/drain of a second conductive type formed in a predetermined portion of the substrate disposed beneath each lateral side of the gate; and a channel ion implantation region of the first conductive type formed in a predetermined region of the substrate disposed beneath the gate; and a voltage generating unit for controlling a threshold voltage of the transistor for use in the memory cell by implanting charges to the gate dielectric structure through supplying a predetermined voltage to each of the substrate, the gate and the source/drain.

In accordance with still another aspect of the present invention, there is provided a method for forming a gate dielectric structure of a volatile memory device, wherein the volatile memory device is defined with a cell region where a transistor for use in a memory cell is formed and a peripheral region where a transistor for use in a logic circuit is formed, including the steps of: sequentially forming a first oxide layer, a dielectric layer for trapping charges and a second oxide layer on a substrate; selectively etching the second oxide layer and the dielectric layer disposed in the peripheral region; etching the first oxide layer exposed in the peripheral region as simultaneously as etching the second oxide layer in the cell region; and forming a third oxide layer in the cell region and in the peripheral region.

In accordance with still another aspect of the present invention, there is provided a method for forming a gate dielectric structure in a volatile memory device, wherein the volatile memory device is defined with a cell region where a first NMOS transistor for use in a memory cell is formed and a peripheral region where a second NMOS transistor for use in a logic circuit and a PMOS transistor for use in a logic circuit are formed, the method including the steps of: sequentially forming a first oxide layer, a dielectric layer for trapping charges and a second oxide layer on a substrate; selectively etching the second oxide layer and the dielectric layer in a first predetermined region of the peripheral region where the second NMOS transistor is formed; removing the first oxide layer exposed in the first predetermined region as simultaneously as etching the second oxide layer disposed in the cell region and in a second predetermined region of the peripheral region where the PMOS transistor is formed; and forming a third oxide layer in the cell region and in the peripheral region.

In accordance with further aspect of the present invention, there is provided a method for forming a gate dielectric structure in a volatile memory device, wherein the volatile memory device is defined with a cell region where a first NMOS transistor for use in a memory cell is formed and a peripheral region where a PMOS transistor for use in a logic circuit and a second NMOS transistor for use in a logic circuit are formed, including the steps of: sequentially forming a first oxide layer, a dielectric layer for trapping charges and a second oxide layer on a substrate; selectively etching the second oxide layer and the dielectric layer in a first predetermined region of the peripheral region where the second NMOS transistor is formed; selectively etching a portion of the second oxide layer in a second predetermined region of the peripheral region where the PMOS transistor is formed to make the second oxide layer have a decreased thickness; removing the first oxide layer exposed in the first predetermined region as simultaneously as removing the second oxide layer in the second predetermined region and a portion of the second oxide layer in the cell region; and forming a third oxide layer in the cell region and the peripheral region.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A transistor of a volatile memory device with a gate dielectric structure capable of trapping charges and a method for fabricating the same in accordance with preferred embodiments of the present invention will be described in detail with reference to the accompanying drawings.

Figure 1:
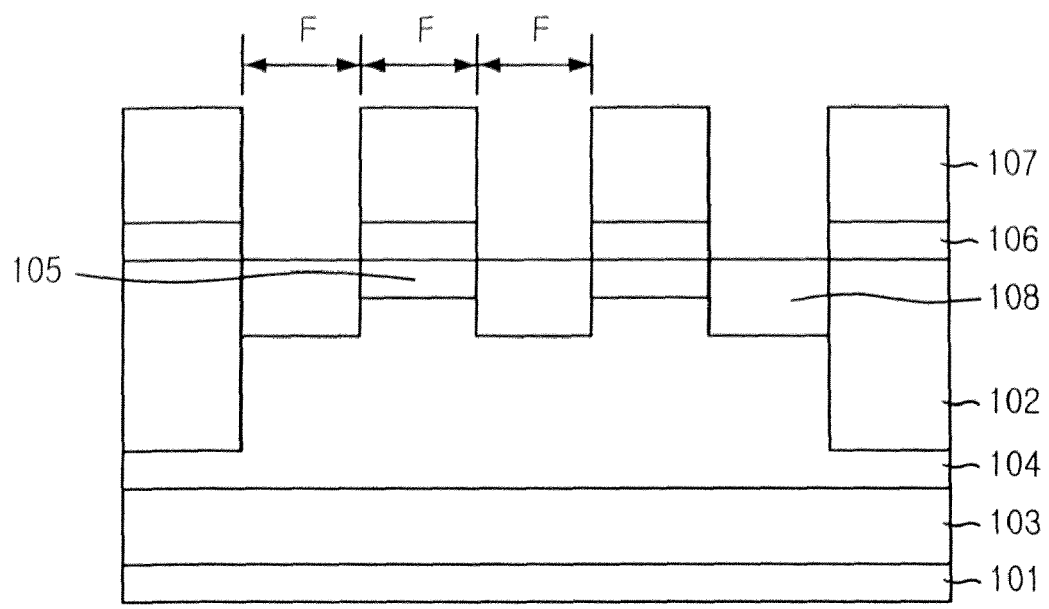
FIG. 1 is a cross-sectional view showing a transistor of a conventional dynamic random access memory (DRAM) device.
Figure 2A:
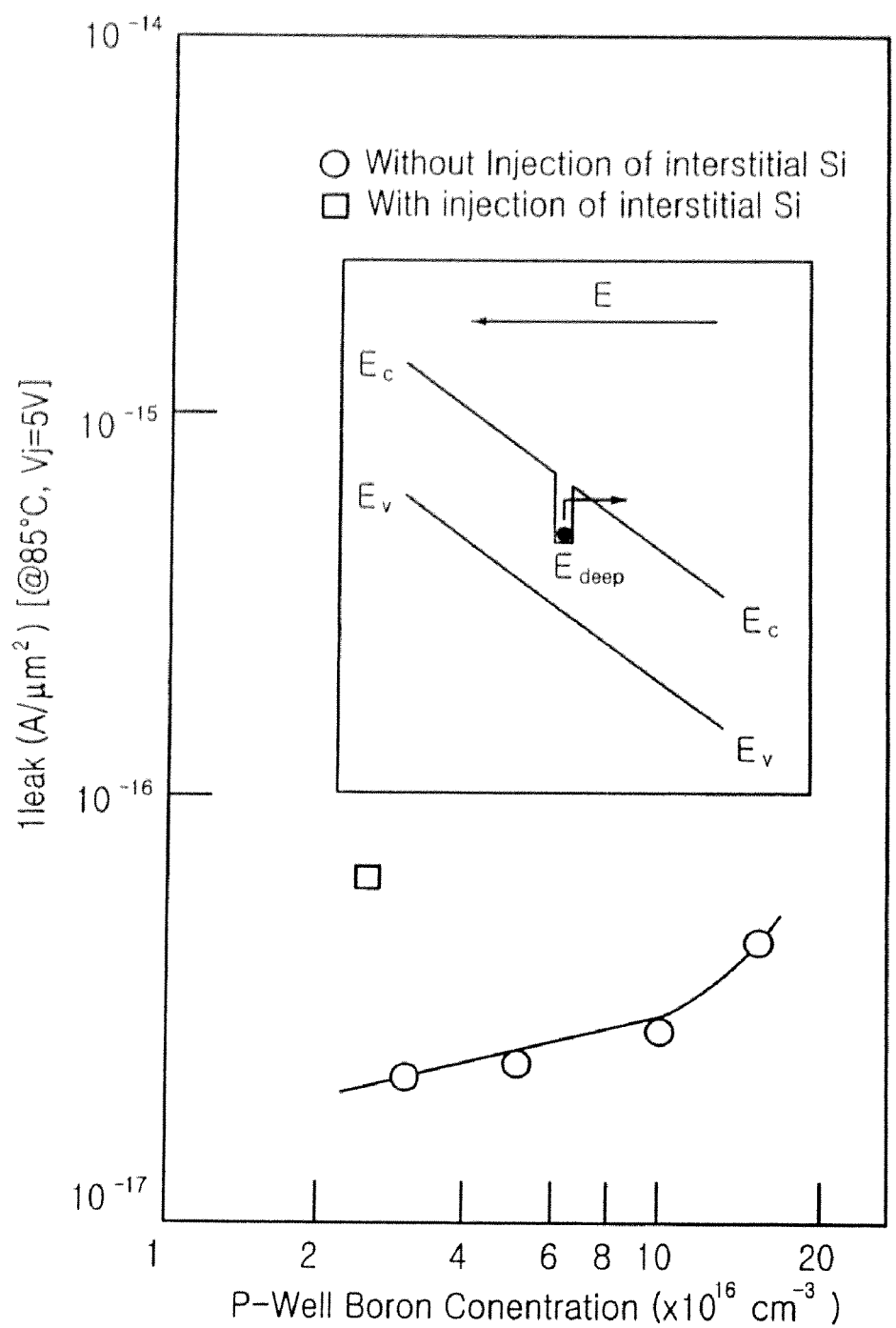
FIG. 2A is a graph showing that a characteristic of junction leakage increasing in proportion to a doping concentration of boron into a P-type well.
Figure 2B:
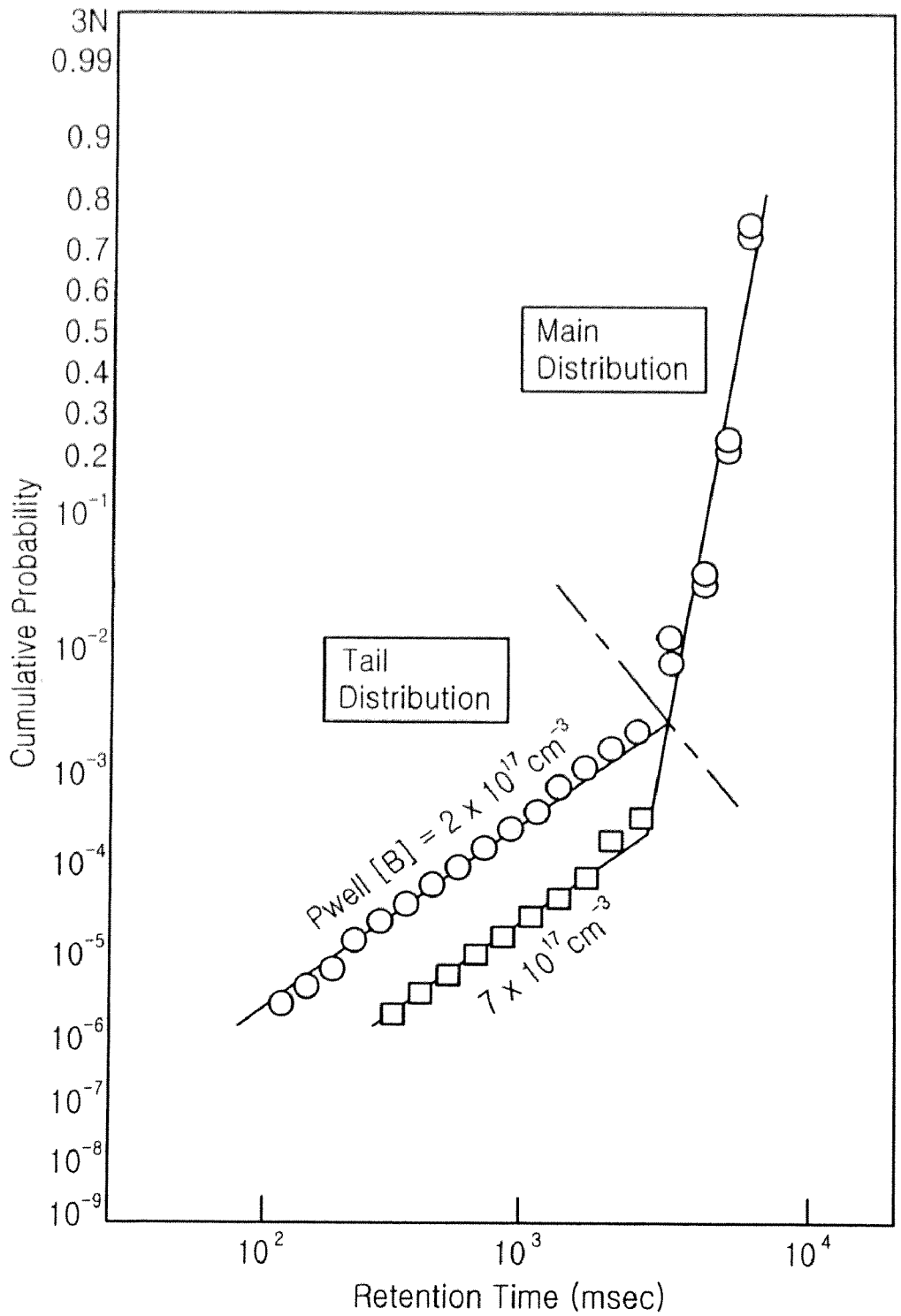
FIG. 2B is a graph showing that a data retention time decreases as a doping concentration of a P-type well increases.
Figure 3:
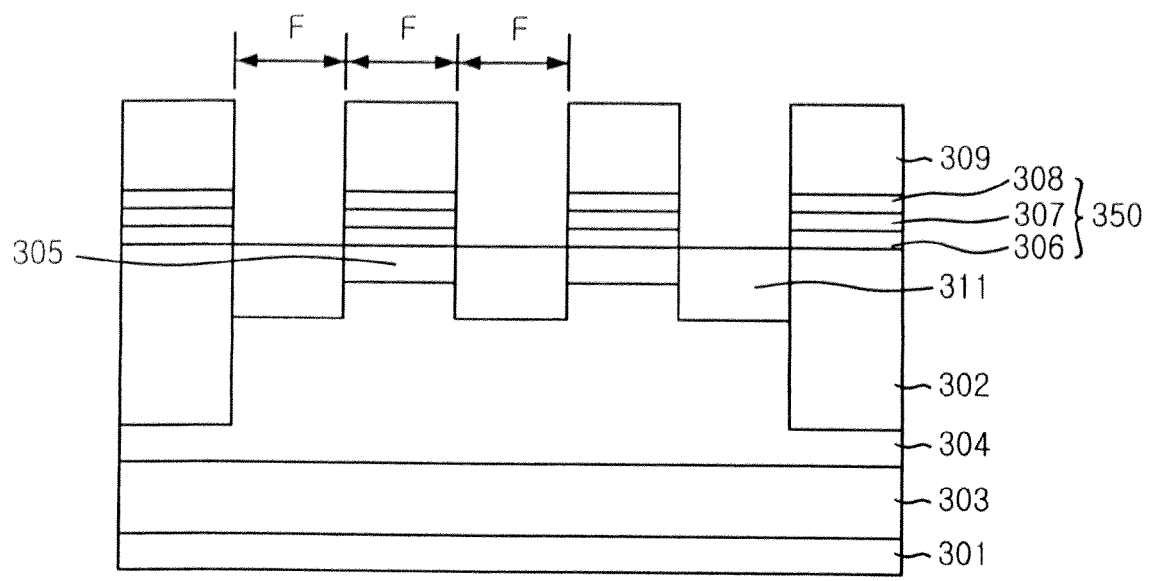
FIG. 3 is a cross-sectional view showing a transistor of a DRAM device wherein the transistor has a gate dielectric structure of oxide, nitride and oxide (ONO) in accordance with the present invention.

FIG. 3 is a cross-sectional view showing a transistor of a dynamic random access memory (DRAM) device in accordance with the present invention. Herein, the transistor has a gate dielectric structure of oxide, nitride and oxide (ONO).

As shown, two wells 303 and 304 are formed in a silicon substrate 301. In a DRAM device, a transistor in a cell region is typically an N-channel transistor, while a P-channel transistor is used in a peripheral circuit region. Thus, the two wells are a deep N-type well 303 formed in the silicon substrate 301 of P-type and a deep P-type well 304 defined within the N-type well 303.

A device isolation layer 302 is formed in the silicon substrate 301 by performing a shallow trench isolation (STI) method. After the formation of the device isolation layer 302, an active region and a field region in which the device isolation layer 302 is formed are defined.

Next, a plurality of gate dielectric structures 350 are formed in the active region of the silicon substrate 301. Then, a plurality of gates 309 are formed on the corresponding gate dielectric structures 350. A channel ion implantation region 305 for controlling a threshold voltage is formed in each of channel regions defined within portions of the P-type well 304 disposed beneath the corresponding gates 309. Also, there is a source/drain 311 in each predetermined region of the silicon substrate 301 allocated between the gates 309.

Herein, the gate dielectric structure 350 includes a first oxide layer 306, which is a bottom gate dielectric layer, a nitride layer 307, which is a middle gate dielectric layer and serves as a charge trapping layer, and a second oxide layer 308, which is a top gate dielectric layer. In other words, the gate dielectric structure 350 has a structure of oxide, nitride and oxide (ONO).

Especially, the nitride layer 307 of the gate dielectric structure 350 plays a role in increasing a threshold voltage of a transistor in a cell region by capturing electrons during sequential processes for fabricating a semiconductor device. This increased threshold voltage can be offset by the channel ion implantation region 305 having a low concentration. As a result, the transistor in accordance with the present invention can obtain an intended threshold voltage along with the channel ion implantation region 305 having a low concentration, thereby obtaining a lowered potential. This lowered potential further results in improvements on junction leakage and refresh characteristics.

Meanwhile, the DRAM device in accordance with the present invention has a separate voltage generator for controlling a threshold voltage by implanting charges, e.g., electrons or holes, to the gate dielectric structure of the transistor. Because of this separate voltage generator, it is possible to control a threshold voltage after the fabrication of the transistor. If the threshold voltage needs to be controlled depending on the use of a circuit, the threshold voltage can be controlled by implanting electrons or holes to the nitride layer 307 of the gate dielectric structure 350 by supplying a predetermined voltage individually to a gate, a drain and a source. This control of the threshold voltage on operation of the transistor of the DRAM device with the gate dielectric structure of ONO is shown in Table 1 provided below. Herein, the gate, the drain and the source are a word line, a bit line BL and a storage node (SN) of a capacitor, respectively.

TABLE 1

|  | Gate | BL | SN | P-well in Cell Region (=Bulk) | Remarks |
| --- | --- | --- | --- | --- | --- |
| $V_{TH}$ control 11 | $V_P$ | 0 V | 0 V | 0V or $V_{BB}$ | Control to increase $V_{TH}$ through electron implantation |
| $V_{TH}$ control 12 | $V_P$ | $V_P$ | 0V | 0 V or $V_{BB}$ | |
| $V_{TH}$ control 21 | 0 V or $V_N$ | $V_P$ | $V_P$ | $V_P$ | Control to decrease $V_{TH}$ through hole implantation |
| $V_{TH}$ control 22 | 0V or $V_N$ | $V_P$ | 0 | 0V or $V_{BB}$ | |
| Read/Write | 0~$V_{PP}$ | 0~$V_{DL}$ | 0~$V_{DL}$ | $V_{BB}$ | Same as a conventional operation recipe |

Herein, '$V_p$', '$V_{pp}$' and '$V_{DL}$' are greater than approximately 0V, and $V_N$ and $V_{BB}$ are less than approximately 0V.

As shown in Table 1, when a voltage is supplied to the gate, the drain and the source as like the case of $V_{TH}$ control and the $V_{TH}$ control 12, electrons are implanted into the nitride layer of the gate dielectric structure, thereby increasing the threshold voltage. On the other hand, when a voltage is supplied individually to the gate, the drain, the source, and the P-well, holes are implanted into the nitride layer of the gate dielectric structure, thereby decreasing the threshold voltage.

Eventually, in a conventional transistor of a DRAM device, it is required to optimize a punch-through voltage, a refresh time and a threshold voltage simultaneously, however, the transistor having the gate dielectric structure of ONO in accordance with the present invention is first fabricated by simultaneously optimizing the punch-through voltage and the refresh time under consideration of an amount of captured charges during the formation of the nitride layer of the gate dielectric structure of ONO. The threshold voltage characteristic can be optimized after the fabrication of the above transistor depending on needs.

As shown in Table 1, as like the read and write operation in the conventional DRAM device, wherein the transistor has only an oxide layer as the gate dielectric structure, the read and write operation on data of the DRAM device can be driven with a high speed under a low voltage.

Figure 4A:
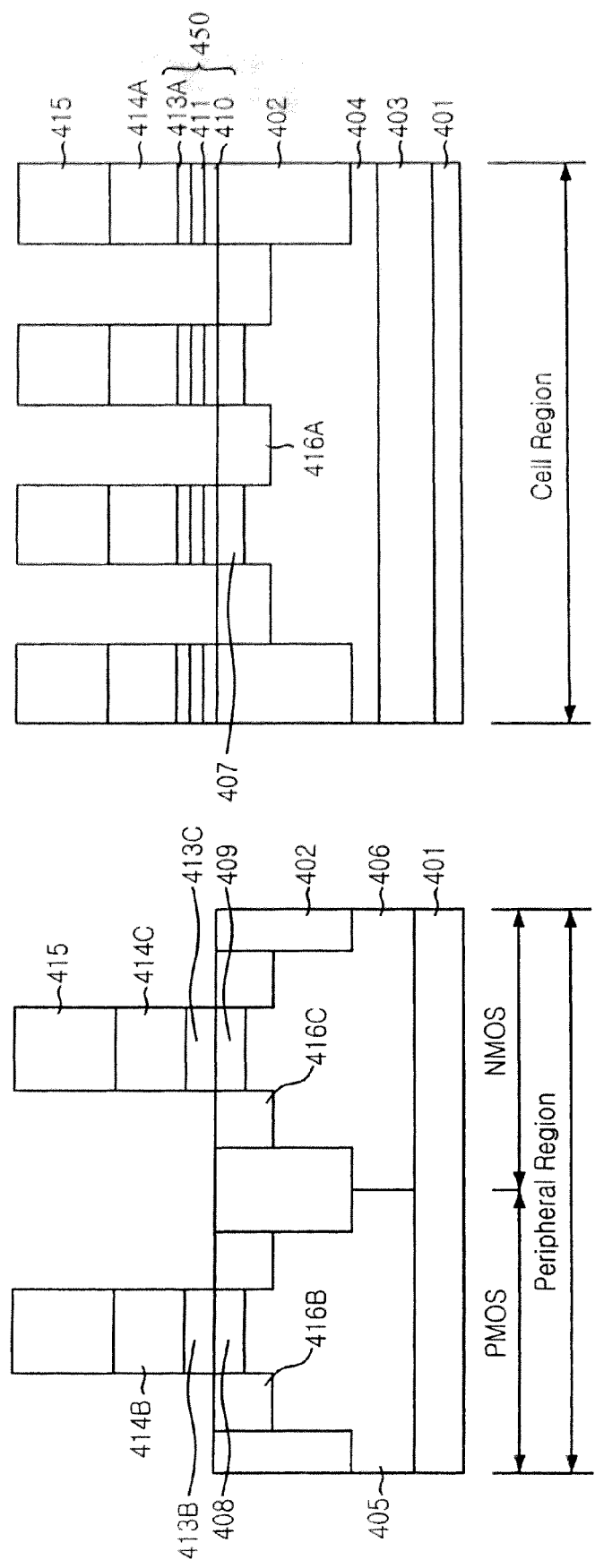
FIG. 4A shows cross-sectional views of a DRAM device provided with NMOS transistors in a cell region having a gate dielectric structure of ONO and NMOS and PMOS transistors in a peripheral region having a gate dielectric structure of a single oxide layer in accordance with a first embodiment of the present invention.
Figure 4B:
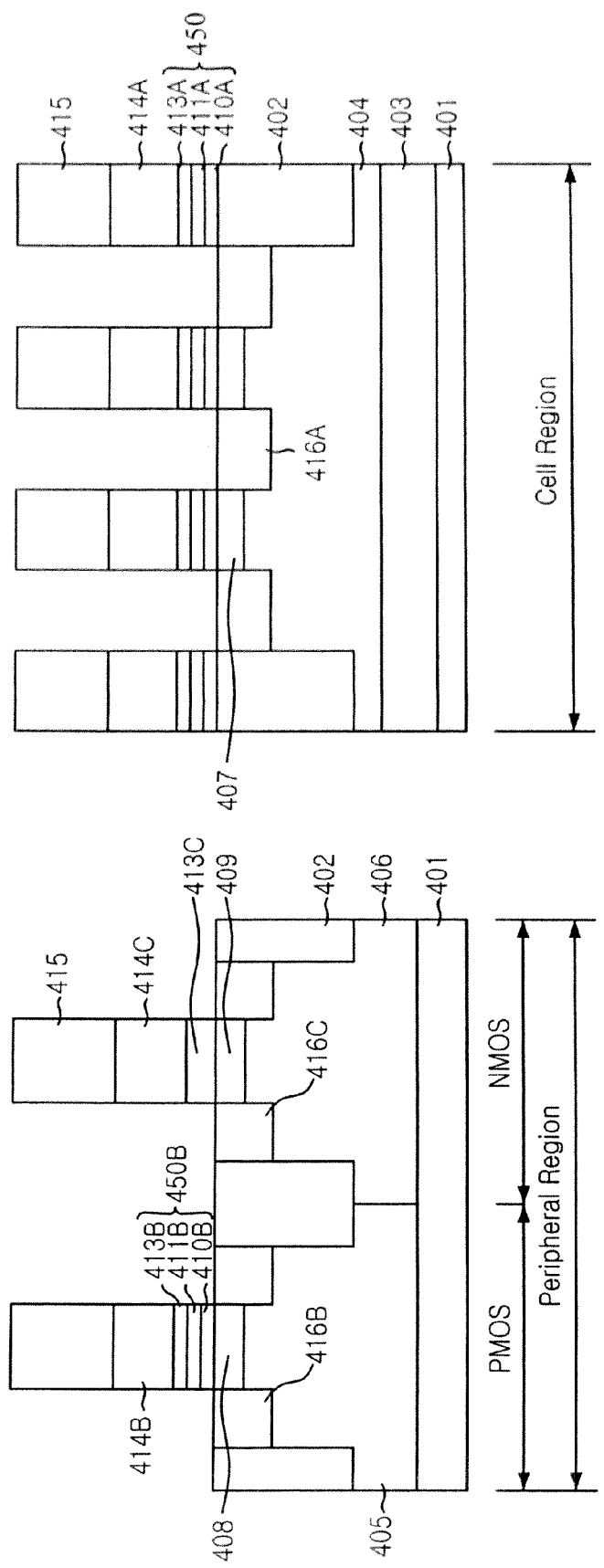
FIG. 4B shows cross-sectional views of a DRAM device provided with NMOS transistors in a cell region and a PMOS transistor in a peripheral region each having a gate dielectric structure of ONO and an NMOS transistor in the peripheral region having a gate dielectric structure of a single oxide layer in accordance with a second and a third embodiments of the present invention.

FIGS. 4A and 4B are cross-sectional views showing a DRAM device integrated with N-channel metal oxide semiconductor (NMOS) transistors in a cell region and P-channel metal oxide semiconductor (PMOS) and NMOS transistors in a logic circuit region, i.e., a peripheral region. Particularly, FIG. 4A shows a first embodiment that the NMOS transistors in the cell region have a gate dielectric structure of ONO and the NMOS and PMOS transistors in the peripheral region have a gate dielectric structure of a single oxide layer. FIG. 4B shows that the NMOS transistors in the cell region and the PMOS transistor in the peripheral region individually have a gate dielectric structure of ONO and the NMOS transistor in the peripheral region has a gate dielectric structure of a single oxide layer in accordance with second and a third embodiments of the present invention. Also, it should be noted that the same reference numerals are used for the same constitution elements described in the first embodiment and the second embodiment.

Referring to FIG. 4A, each of the NMOS transistors in the cell region has a gate dielectric structure 450 of ONO including a first oxide layer 410, a nitride layer 411 and a second oxide layer 413A. Herein, the first oxide layer 410, the nitride layer 411 and the second oxide layer 413A are a bottom gate dielectric layer, a middle gate dielectric layer functioning as a charge trapping layer and a top gate dielectric layer, respectively. On the other hand, the NMOS transistor and the PMOS transistor in the peripheral region individually have a gate dielectric structure of a single oxide layer, denoted with a reference numeral 413B for the PMOS transistor and with a reference numeral 413C for the NMOS transistor.

Herein, an effective thickness ($T_{OX}$) of the gate dielectric structure 450 including the first oxide layer 410, the oxide layer 411 and the second oxide layer 413A in the cell region is equal to or greater than that of the gate dielectric structure of the single oxide layer 413B or 413C in the peripheral region.

Also, as described above, the nitride layer 411 of the gate dielectric structure 450 in the cell region serves as the charge trapping layer. In addition to the use of nitride for the charge trapping layer, it is still possible to use aluminum oxide and hafnium oxide capable of capturing charges.

More specific to the first embodiment, in the cell region where the NMOS transistors are formed, a deep N-type well 403 is formed in a substrate 401, and a deep P-type well 404 is defined within the deep N-type well 403. A plurality of gate dielectric structures 450 are formed on predetermined portions of the P-type well 403. Herein, as described above, each of the gate dielectric structures 450 includes the first oxide layer 410, the nitride layer 411 and the second oxide layer 413A. Also, a plurality of gates 414A are formed on the corresponding gate dielectric structures 450. Also, a gate insulation layer 415 is formed on each of the gate 414A. Also, there are channel ion implantation regions 407 each formed in a predetermined region disposed beneath the corresponding gate 414A, i.e., each channel region of the P-type well 404 and sources/drains 416A each formed in a predetermined region of the substrate 401 disposed between each two of the gates 414A.

Also, in the peripheral region where the PMOS transistors are formed, there is an N-type well 405 defined within a substrate 401. A gate dielectric structure of a single oxide layer 413B is formed on a predetermined portion of the N-type well 405. A gate 414B and a gate insulation layer 415 are sequentially formed on the gate dielectric structure of the single oxide layer 413B. A channel ion implantation region 408 is formed in a channel region of the N-type well 405 disposed beneath the gate 414B and the gate dielectric structure of the single oxide layer 413B, and a source/drain 416B is formed in each predetermined region of the substrate 401 disposed beneath each lateral side of the gate 414B.

Further, in the peripheral region where the NMOS transistor is formed, there is a P-type well 406 defined within the substrate 401. A gate dielectric structure of a single oxide layer 413C is formed on a predetermined portion of the P-type well 406. A gate 414C and a gate insulation layer 415 are sequentially formed on the gate dielectric structure of the single oxide layer 413C. A channel ion implantation region 409 is formed in a channel region of the P-type well 406 disposed beneath the gate 414C and the gate dielectric structure of the single oxide layer 413C, and a source/drain 416C is formed in each predetermined region of the substrate 401 disposed beneath each lateral side of the gate 414C.

Referring to FIG. 4B, in a cell region where NMOS transistors are formed, a deep N-type well 403 is formed in a substrate 401, and a deep P-type well 404 is defined within the deep N-type well 403. A plurality of gate dielectric structures 450A are formed on predetermined portions of the P-type well 404. Herein, each of the gate dielectric structures 450A includes a first oxide layer 410A, a nitride layer 411A and a second oxide layer 413A. The nitride layer 411A is a charge trapping layer. Also, a plurality of gates 414A are formed on the corresponding gate dielectric structures 450A. A gate insulation layer 415 is then formed on each of the gates 414A. Also, there are channel ion implantation regions 107 each formed in a predetermined region disposed beneath the gate 414A and the gate dielectric structure 450A, i.e., each channel region of the P-type well 404, and sources/drains 416A each formed in a predetermined portion of the substrate 401 disposed between each two of the gates 414A.

In a peripheral region where an PMOS transistor is formed, a deep N-type well 405 is formed in a substrate 401. A gate dielectric structure 450B is formed on a predetermined portion of the P-type well 405. Herein, the gate dielectric structure 450B includes a first oxide layer 410B, a nitride layer 411B and a second oxide layer 413B. A gate 414B and a gate insulation layer 415 are then sequentially formed on the gate dielectric structure 450B. Also, there are a channel ion implantation region 408 formed in a predetermined region disposed beneath the gate 414B and the gate dielectric structure 450B, i.e., a channel region of the N-type well 405, and a source/drain 416B formed in each predetermined portion of the substrate 401 disposed beneath each lateral side of the gate 414B.

Further, in the peripheral region where an NMOS transistor is formed, there is a P-type well 406 defined within the substrate 401. A gate dielectric structure of a single oxide layer 413C is formed on a predetermined portion of the P-type well 406. A gate 414C and a gate insulation layer 415 are sequentially formed on the gate dielectric structure of the single oxide layer 413C. A channel ion implantation region 409 is formed in a channel region of the P-type well 406 disposed beneath the gate 414C and the gate dielectric structure of the single oxide layer 413C, and a source/drain 416C is formed in each predetermined region of the substrate 401 disposed beneath each lateral side of the gate 414C.

In accordance with the second and the third embodiments, a thickness of an effective oxide layer of the gate dielectric structure 450A in the cell region is equal to or greater than that of an effective oxide layer of the gate dielectric structure 450B in the peripheral region and that of an effective oxide layer of the gate dielectric structure of the single oxide layer 413C in the peripheral region. Also, the nitride layer 411A of the gate dielectric structure 450A in the cell region is a charge trapping layer, and can be replaced with an oxynitride layer, aluminum oxide layer, or a hafnium oxide layer capable of trapping charges.

FIGS. 5A to 5D are cross-sectional views illustrating a method for fabricating the DRAM device shown in FIG. 4A.

Figure 5A:
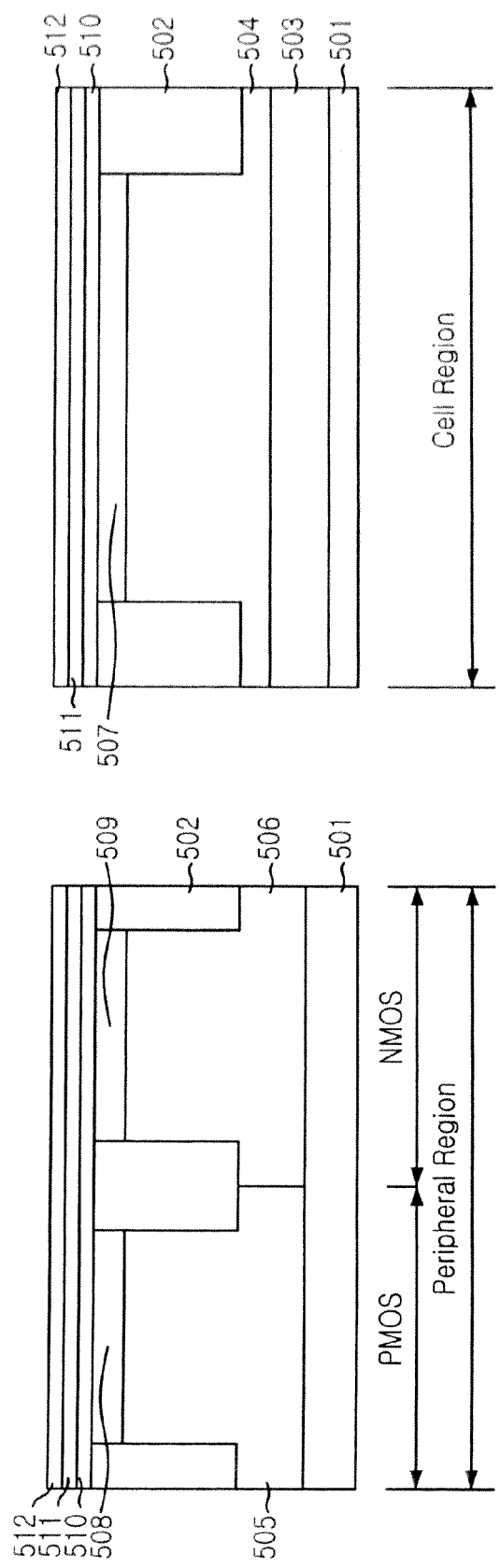
FIGS. 5A to 5D are cross-sectional views illustrating a method for fabricating the DRAM device shown in FIG. 4A in accordance with the first embodiment of the present invention.

Referring to FIG. 5A, a field oxide layer 502 is formed in a substrate 501 made of silicon. In a cell region, a deep N-type well 503 and a deep P-type well 504 are formed. In a peripheral region, an N-type well 505 and a P-type well 506 are formed. A P-type impurity is ion implanted into each of the P-type wells 504 and 506 formed in the cell region and the peripheral region, respectively, thereby forming channel ion implantation regions 507 and 509 in the cell region and the peripheral region, respectively. Meanwhile, an N-type impurity is ion implanted into the N-type well 505 to form a channel ion implantation region 508 in the peripheral region.

Next, a gate dielectric structure is formed. More specifically, a first oxide layer 510, which is a bottom gate dielectric layer, is formed on the substrate 501. Then, middle gate dielectric layer 511 is formed on the first oxide layer 510. Herein, the middle gate dielectric layer 511 is made of a material capable of trapping charges, and this type of material is selected from a group consisting of nitride, oxynitride, alumina ($Al_2O_3$) and hafnium oxide ($HfO_2$). The oxynitride layer can be formed by applying a dinitrogen oxide ($N_2O$) treatment or a nitrogen oxide (NO) treatment to the first oxide layer 510. After the formation of the middle gate dielectric layer 511, a second oxide layer 512 is formed on the middle gate dielectric layer 511. Herein, the second oxide layer 512 serves as a buffer oxide layer.

Figure 5B:
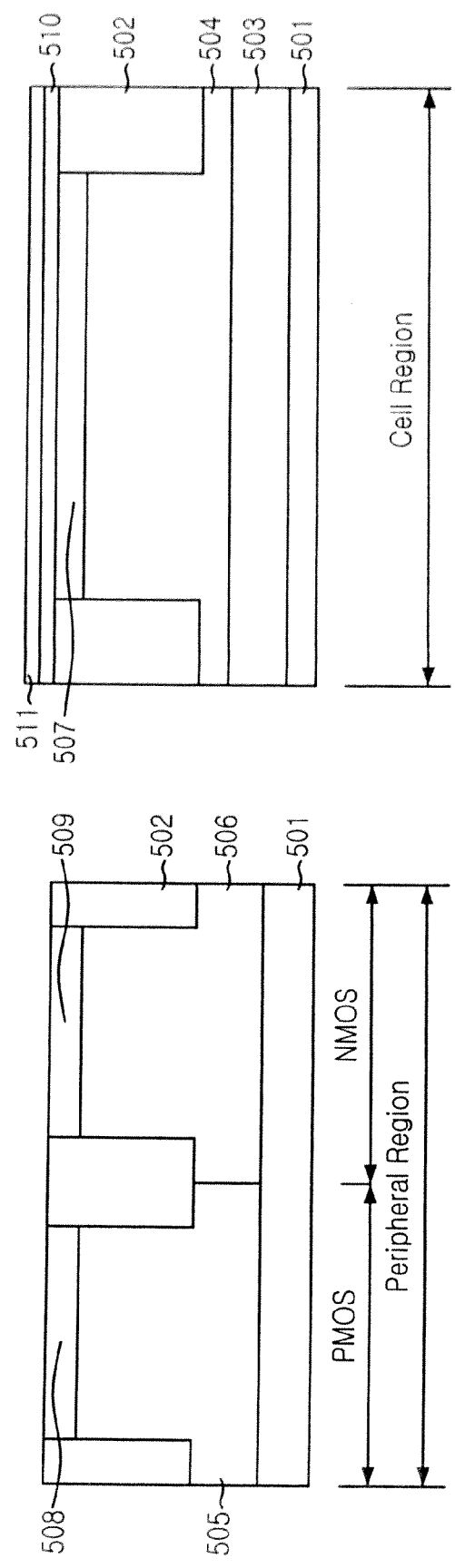

Referring to FIG. 5B, although not illustrated, a photosensitive layer is formed on the above resulting substrate structure and is patterned such that the photosensitive layer remains in the cell region. The second oxide layer 512 and the middle gate dielectric layer 511 in the peripheral region are etched. Then, the photosensitive layer is removed, and the first oxide layer 510 in the peripheral region is etched thereafter. When the first oxide layer 510 in the peripheral region is etched, the second oxide layer 512 in the cell region is etched away, or a portion of the second oxide layer 12 remains. Herein, the etching process proceeds by performing one of a dry etching process a wet etching process.

Figure 5C:
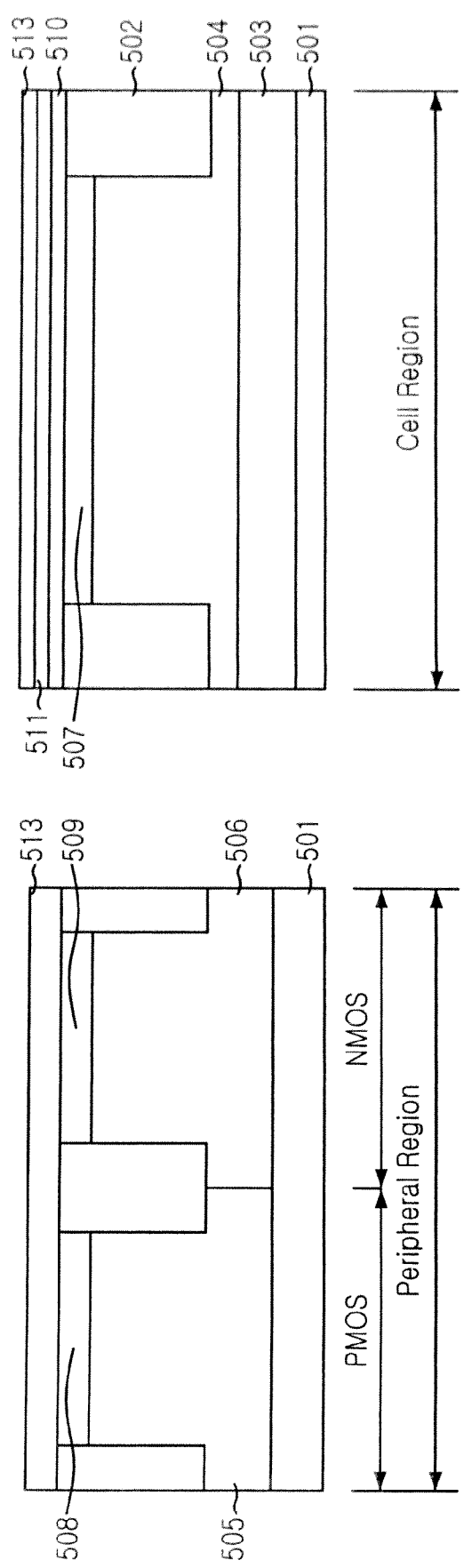

Referring to FIG. 5C, a third oxide layer 513 serving as a top gate dielectric layer is formed on the middle gate dielectric layer 511 in the cell region, while in the peripheral region, the third oxide layer 513 is formed on the substrate 501. Herein, in the cell region, a gate dielectric structure including the first oxide layer 510, the middle gate dielectric layer 511 and the third oxide layer 513 is formed.

At this time, the third oxide layer 513 is preferably formed by performing a thermal oxidation process. In case that the middle gate dielectric layer 511 is made of nitride, a thickness of the third oxide layer 513 formed on the nitride-based middle gate dielectric layer 511 in the cell region is thinner than that of the third oxide layer 513 formed in the peripheral region. Thus, it is preferable to control a thickness of the remaining second oxide layer 512, or to control the thickness of the third oxide layer 513 such that a thickness of an effective oxide layer of the gate dielectric structure in the cell region is equal to or greater than a thickness of the third oxide layer 513 in the peripheral region.

That is, when the second oxide layer 512 in the cell region is etched, a remaining thickness of the second oxide layer 512 is controlled to form the gate dielectric structure in the cell region by including the first oxide layer 510, the middle dielectric layer 511, the second oxide layer 512 and the third oxide layer 513, or by including the first oxide layer 510, the middle dielectric layer 511 and the third oxide layer 513 and to form the gate dielectric structure in the peripheral region by including only the third oxide layer 513.

Figure 5D:
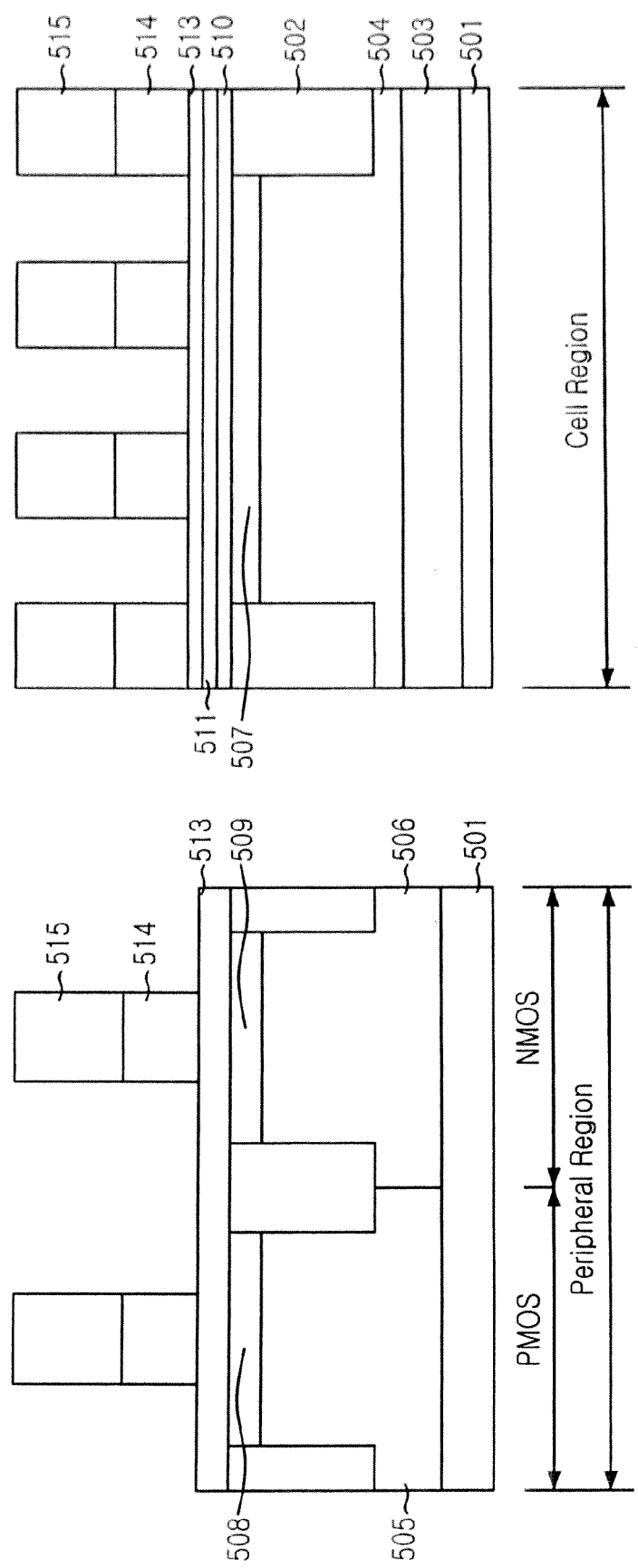

Referring to FIG. 5D, a gate material 514 and a gate insulation layer 515 are formed on the third oxide layer 513 and are then patterned by performing an etching process with use of a gate mask. Afterwards, typical DRAM fabrication processes, e.g., a source/drain formation process, proceed to complete the fabrication of the DRAM device.

Meanwhile, the DRAM device shown in FIG. 4B is fabricated by the same processes described in FIGS. 5A to 5D in the exception that a second oxide layer and a middle gate dielectric layer disposed in a PMOS region where a PMOS transistor is formed in the peripheral region are masked during the etching of the second oxide layer and the middle gate dielectric layer in the peripheral region.

With reference to FIGS. 6A to 6D and FIGS. 7A to 7E, detailed description on a method for fabricating the DRAM device shown in FIG. 4B will be described in detail hereinafter. Also, in FIGS. 6A to 7E, the same reference numerals are used for the same constitution elements described in FIGS. 5A to 5D.

FIGS. 6A to 6D are cross-sectional views showing a method for fabricating the DRAM in accordance with a second embodiment of the present invention.

Figure 6A:
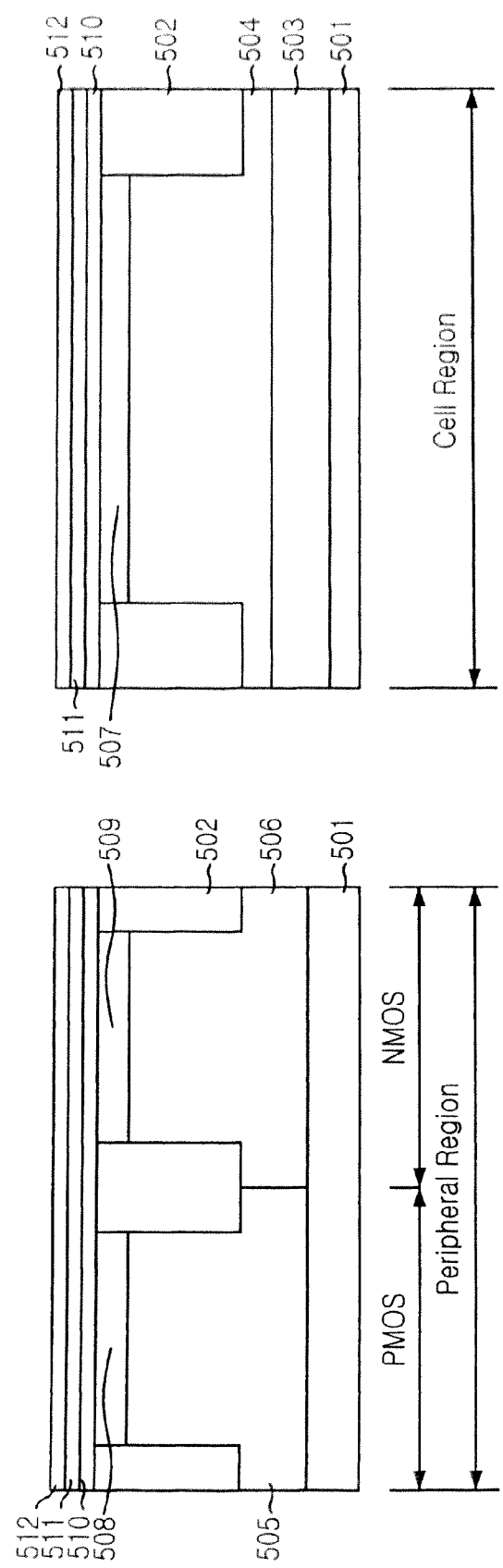
FIGS. 6A to 6D are cross-sectional views illustrating a method for fabricating the DRAM device shown in FIG. 4B in accordance with the second embodiment of the present invention.

Referring to FIG. 6A, a field oxide layer 502 is formed in a substrate 501 made of silicon. In a cell region, a deep N-type well 503 and a deep P-type well 504 are formed. In a peripheral region, an N-type well 505 and a P-type well 506 are formed. A P-type impurity is ion implanted into each of the P-type wells 504 and 506 respectively formed in the cell region and the peripheral region to form channel ion implantation regions 507 and 509 in the cell region and the peripheral region, respectively. Meanwhile, an N-type impurity is ion implanted into the N-type well 505 to form a channel ion implantation region 508 in the peripheral region.

Next, gate dielectric structure is formed. More specifically, a first oxide layer 510, which is a bottom gate dielectric layer, is formed on the substrate 501. Then, a middle dielectric layer 511 is formed on the first oxide layer 510. Herein, the middle gate dielectric layer 511 is made of a material capable of trapping charges, and this type of material is selected from a group consisting of nitride, oxynitride, alumina ($Al_2O_3$) and hafnium oxide ($HfO_2$). The oxynitride layer can be formed by applying a dinitrogen oxide ($N_2O$) treatment or a nitrogen oxide (NO) treatment to the first oxide layer 510. After the formation of the middle gate dielectric layer 511, a second oxide layer 512 is formed on the middle gate dielectric layer 511. Herein, the second oxide layer 512 serves as a buffer oxide layer.

Figure 6B:
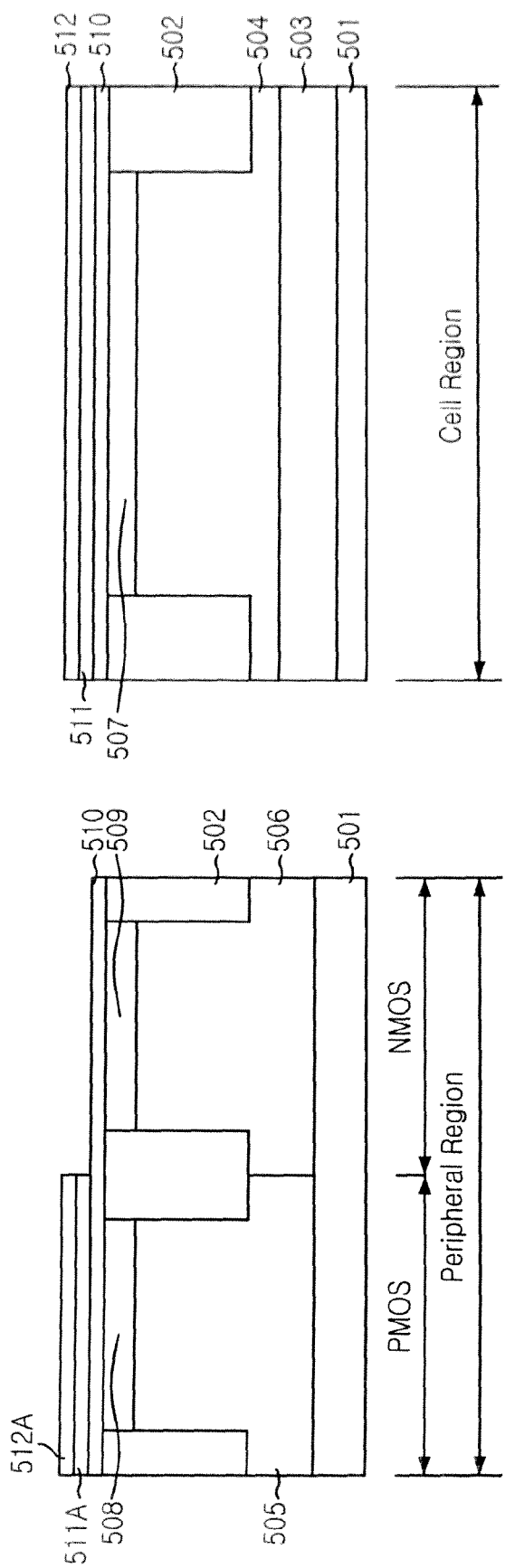

Referring to FIG. 6B, in a predetermined region of the peripheral region where an NMOS transistor will be formed (hereinafter referred to the NMOS region), the second oxide layer 512 and the middle gate dielectric layer 511 are selectively are etched, thereby obtaining a patterned second oxide layer 512A and a patterned middle gate dielectric layer 511A. Also, the etching process proceeds by employing one of a dry etching process or a wet etching process.

Figure 6C:
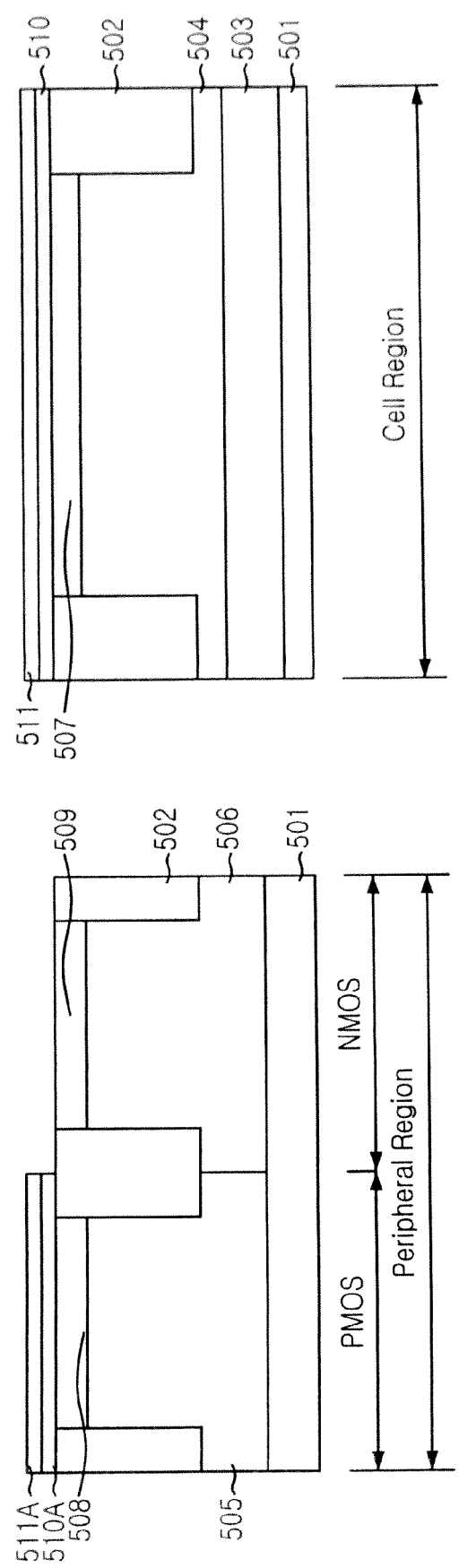

Referring to FIG. 6C, the first oxide layer 510 exposed in the NMOS region is etched as simultaneously as the second oxide layer 512 disposed in the cell region and the patterned second oxide layer 512A in a predetermined region of the peripheral region where a PMOS transistor will be formed (hereinafter referred to as the PMOS region) are etched. After this etching process, a patterned middle gate dielectric layer 511A and a patterned first oxide layer 510A are obtained in the PMOS region.

Figure 6D:
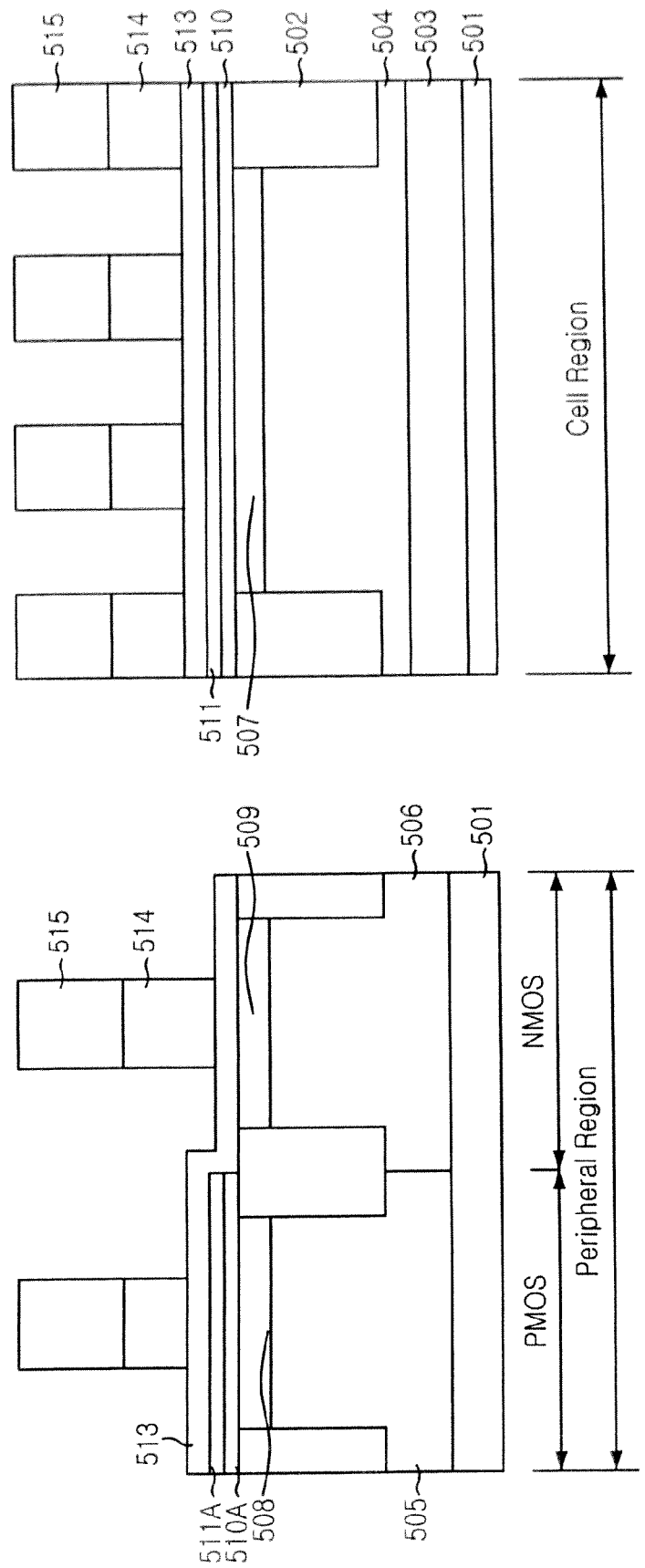

Referring to FIG. 6D, a third oxide layer 513 serving as a top gate dielectric layer is formed on the above resulting structure. The third oxide layer 513 is preferably formed by performing a thermal oxidation process. Afterwards, a gate material 514 and a gate insulation layer 515 are formed on the third oxide layer 513 and are then patterned by performing an etching process with use of a gate mask. Afterwards, typical DRAM fabrication processes, e.g., a source/drain formation process, proceed to complete the fabrication of the DRAM device.

FIGS. 7A to 7E are cross-sectional views showing a method for fabricating the DRAM device in accordance with a third embodiment of the present invention.

Figure 7A:
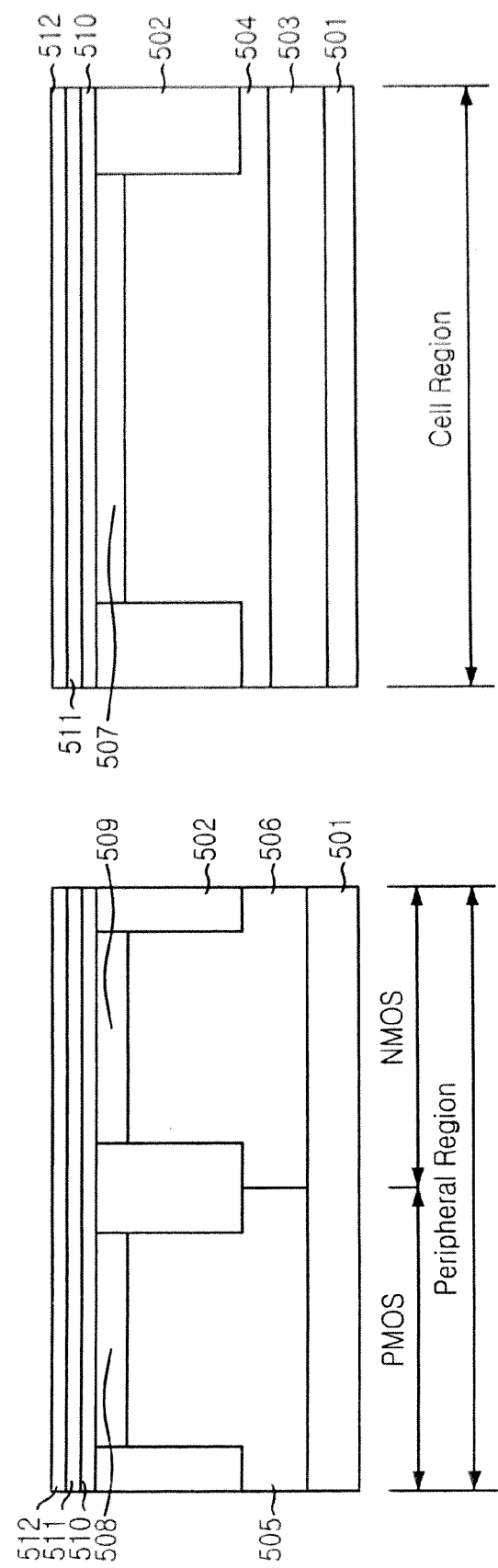
FIGS. 7A to 7E are cross-sectional views illustrating a method for fabricating the DRAM device shown in FIG. 4B in accordance with the third embodiment of the present invention.

Referring to FIG. 7A, a first oxide layer 510, a middle gate dielectric layer 511 and a second oxide layer 512 are sequentially formed on a semi-finished substrate structure including various device elements. Herein, the semi-finished substrate structure is prepared by using the same processes described in FIGS. 5A to 5D, and detailed description on the employed processes is omitted. Herein, the middle gate dielectric layer 511 is made of a material capable of trapping charges, and this type of material is selected from a group consisting of nitride, oxynitride, $Al_2O_3$ and $HfO_2$. The oxynitride layer can be formed by applying an $N_2O$ treatment or an NO treatment to the first oxide layer 510. Also, the second oxide layer 512 serves as a buffer oxide layer.

Figure 7B:
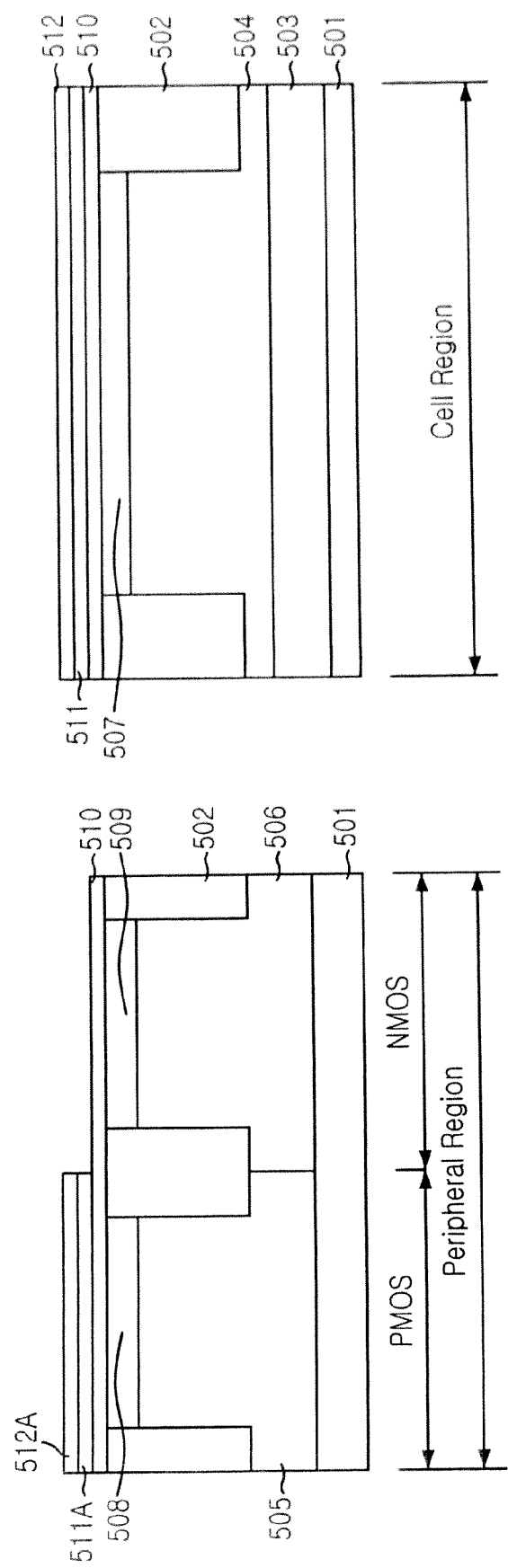

Referring to FIG. 7B, in an NMOS region, the second oxide layer 512 and the middle dielectric layer 511 are selectively etched, thereby obtaining a patterned second oxide layer 512A and a patterned middle gate dielectric layer 511A. At this time, the etching process proceeds by employing one of a dry etching process and a wet etching process.

Figure 7C:
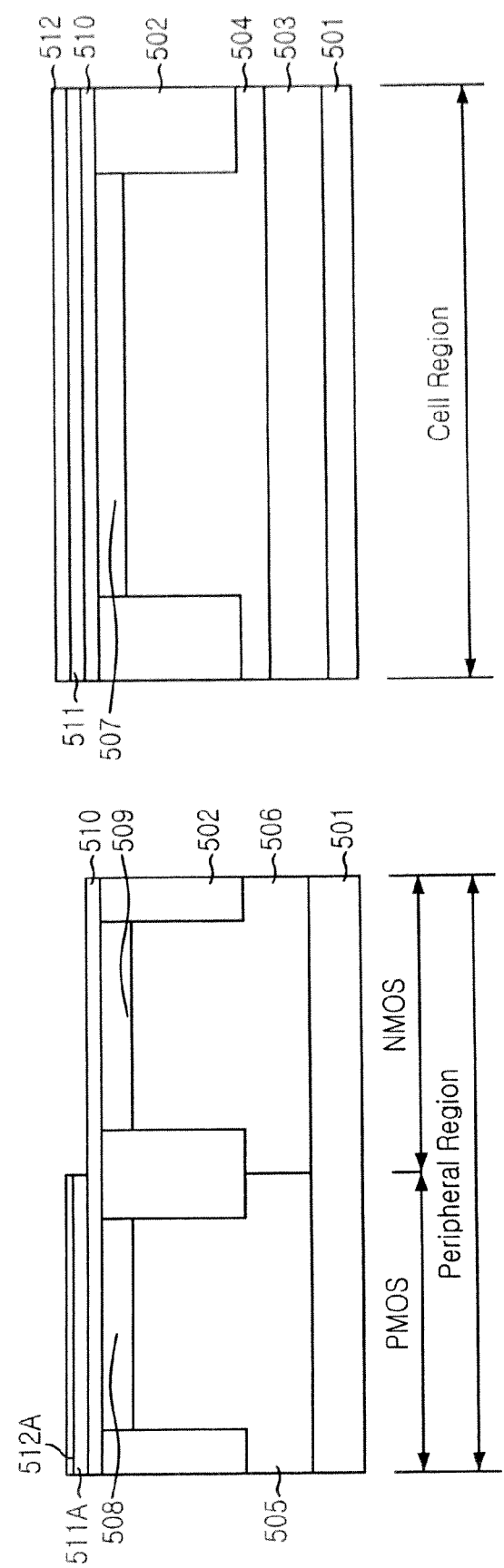

As shown in FIG. 7C, a portion of the patterned second oxide layer 512A in a PMOS region is selectively etched.

Figure 7D:
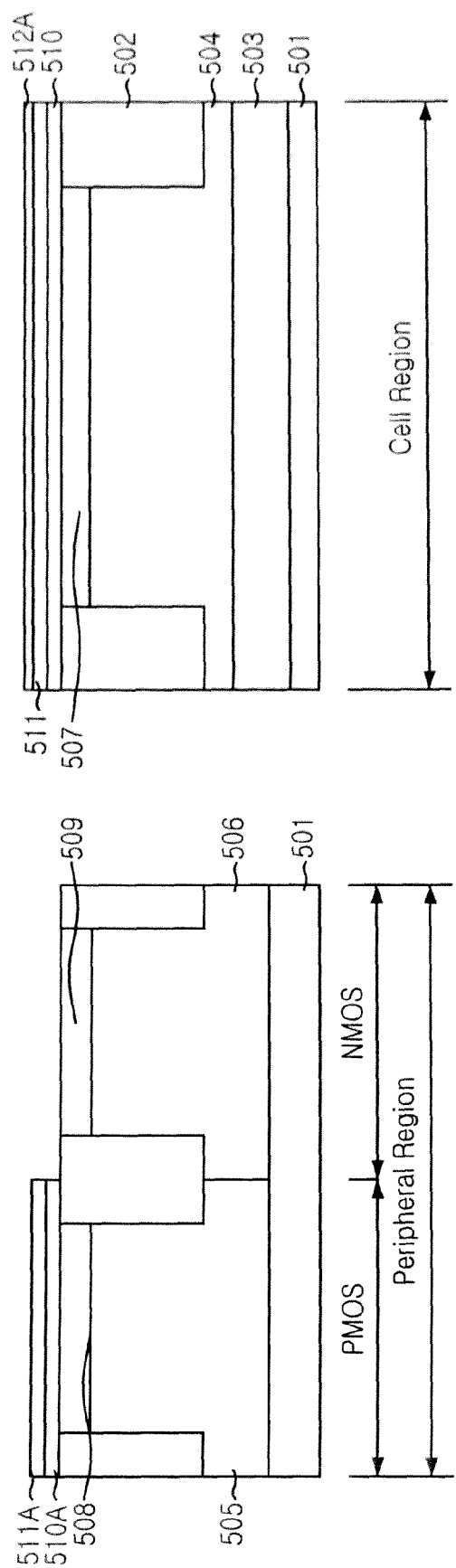

Referring to FIG. 7D, the first oxide layer 510 exposed in the NMOS region and a remaining portion of the patterned second oxide layer 512A in the PMOS region are removed. As simultaneously as these removals, a portion of the second oxide layer 512 in the cell region is also removed. Herein, a remaining portion of the second oxide layer 512 is denoted with a reference numeral 512A.

Figure 7E:
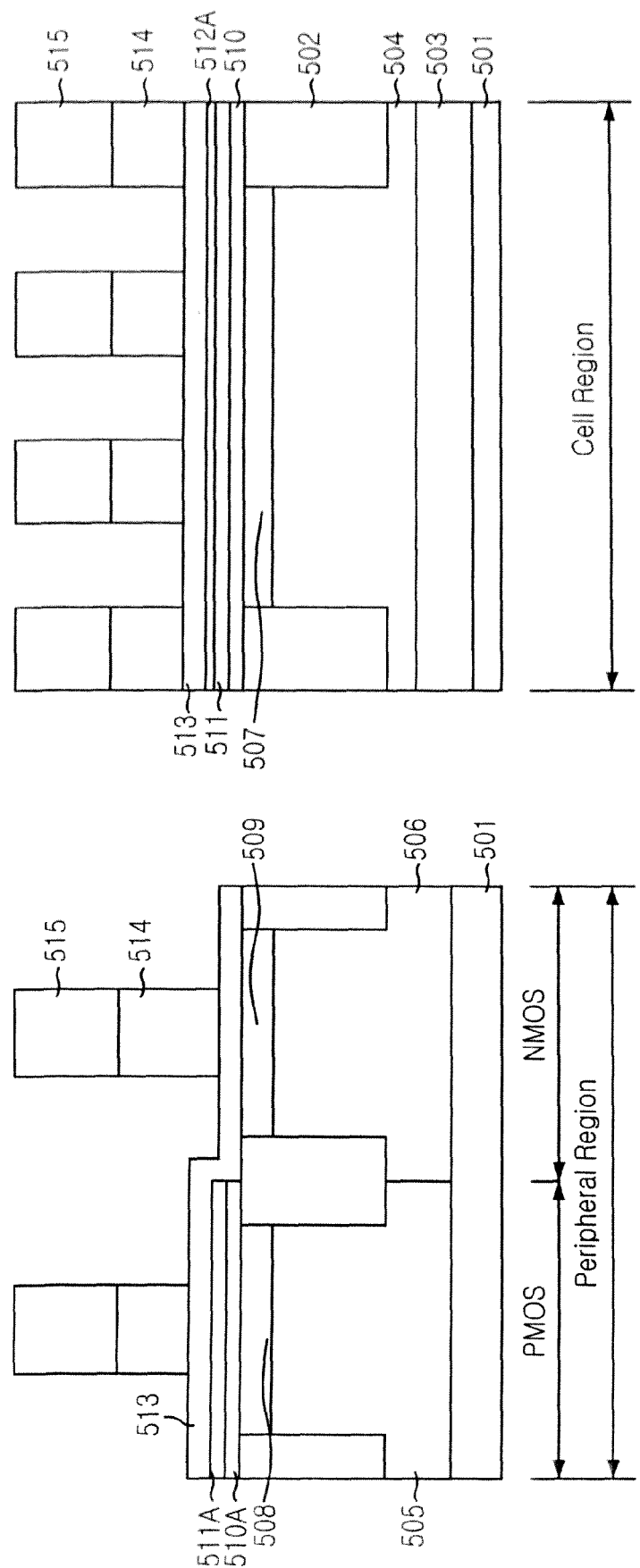

Referring to FIG. 7E, a third oxide layer 513 serving as a top gate dielectric layer is formed on the above resulting structure. The third oxide layer 513 is preferably formed by performing a thermal oxidation process. Afterwards, a gate material 514 and a gate insulation layer 515 are formed on the third oxide layer 513 and are then patterned by performing an etching process with use of a gate mask. Afterwards, typical DRAM fabrication processes, e.g., a source/drain formation process, proceed to complete the fabrication of the DRAM device.

As described in the above first to third embodiments of the present invention, through a complete removal of the second oxide layer in the cell region and in the peripheral region, or through a control of a remaining thickness of the second oxide layer, it is possible to make a thickness of an effective oxide layer of a gate dielectric structure in the cell region and that of an effective oxide layer of a gate dielectric structure in the PMOS region equal to or greater than that of a gate dielectric structure in the NMOS region, or to make a thickness of the effective oxide layer of the gate dielectric structure in the PMOS region equal to that of the effective oxide layer of the gate dielectric structure in the NMOS region, but less than that of the effective oxide layer of the gate dielectric structure in the cell region.

That is, by controlling an etch target thickness of the second oxide layer when the second oxide layer formed in the cell region and the PMOS region is etched, the gate dielectric structure in the cell region and that in the PMOS region of the peripheral region includes the first oxide layer, the middle dielectric layer capable of trapping charges, the remaining portion of the second oxide layer and the third oxide layer 513, or includes the first oxide layer, the middle dielectric layer and the third oxide layer, while the gate dielectric structure in the NMOS region of the peripheral region includes only the third oxide layer.

It is also possible to make the gate dielectric structure in the cell region include the first oxide layer, the middle dielectric layer, the remaining second oxide layer and the third oxide layer, while the gate dielectric structure in the PMOS transistor includes the first oxide layer, the middle dielectric layer and the third oxide layer. At this time, the gate dielectric structure in the NMOS region of the peripheral region includes only the third oxide layer.

In accordance with the first to the third embodiments of the present invention, it is possible to control a threshold voltage value by using a nitride layer capable of trapping charges as a dielectric layer. Thus, even if the design rule is decreased to below approximately 100 nm, a doping concentration of the channel ion implantation region can be decreased, thereby improving a junction leakage current characteristic and a refresh characteristic as simultaneously as obtaining an intended threshold voltage value and a punch through characteristic.

The present application contains subject matter related to the Korean patent application No. KR 2004-0019363, filed in the Korean Patent Office on Mar. 22, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A volatile memory device, comprising: a first N-channel metal oxide semiconductor (NMOS) transistor for use in a memory cell provided with a gate dielectric structure including:
    a bottom gate dielectric layer; a middle gate dielectric layer; and
    a top gate dielectric layer; a second NMOS transistor for use in a logic circuit provided with a gate dielectric structure of a single oxide layer; and
    a P-channel metal oxide semiconductor (PMOS) transistor for use in a logic circuit provided with a gate dielectric structure including:
    a bottom gate dielectric layer;
    a middle gate dielectric layer; and
    a top gate dielectric layer.

2. The volatile memory device of claim 1, wherein an effective oxide layer of the gate dielectric structure of the first NMOS transistor and an effective oxide layer of the gate dielectric structure of the PMOS transistor have a thickness equal to that of the gate dielectric structure of the second NMOS transistor.

3. The volatile memory device of claim 1, wherein an effective oxide layer of the gate dielectric structure of the first NMOS transistor and an effective oxide layer of the gate dielectric structure of the PMOS transistor have a thickness greater than that of an effective oxide layer of the gate dielectric structure of the second NMOS transistor.

4. The volatile memory device of claim 1, wherein an effective oxide layer of the gate dielectric structure of the PMOS transistor has a thickness equal to that of an effective oxide layer of the gate dielectric structure of the second NMOS transistor, and an effective oxide layer of the gate dielectric structure of the first NMOS transistor has a thickness greater than that of the effective oxide layer of the gate dielectric structure of the PMOS transistor and that of the effective oxide layer of the gate dielectric structure of the second NMOS transistor.

5. The volatile memory device of claim 1, wherein each middle dielectric layer of the first NMOS transistor and the PMOS transistor is implanted with electrons to increase a threshold voltage.

6. The volatile memory device of claim 1, wherein each middle dielectric layer of the first NMOS transistor and the PMOS transistor are implanted with holes to decrease a threshold voltage.

7. The volatile memory device of claim 1, wherein each bottom gate dielectric layer and each top gate dielectric layer of the first NMOS transistor and the PMOS transistor are made of oxide and each middle gate dielectric layer of the first NMOS transistor and the PMOS transistor is made of nitride.

8. The volatile memory device of claim 1, wherein each bottom gate dielectric layer and each top gate dielectric layer of the first NMOS transistor and the PMOS transistor are made of oxide and each middle gate dielectric layer of the first NMOS transistor and the PMOS transistor is made of a material selected from a group consisting of oxynitride, aluminum oxide and hafnium oxide.

* * * * *